US008877545B2

(12) United States Patent
Shigematsu et al.

(10) Patent No.: US 8,877,545 B2
(45) Date of Patent: Nov. 4, 2014

(54) METHOD OF MANUFACTURING SOLAR CELL

(71) Applicant: Sanyo Electric Co., Ltd., Moriguchi (JP)

(72) Inventors: Masato Shigematsu, Osaka (JP); Koichi Kubo, Kaizuka (JP); Takahiro Mishima, Kobe (JP); Yasuko Hirayama, Kobe (JP); Taiki Hashiguchi, Kaizuka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 13/752,519

(22) Filed: Jan. 29, 2013

(65) Prior Publication Data
US 2013/0139876 A1 Jun. 6, 2013

Related U.S. Application Data

(63) Continuation of application No. PCT/JP2011/067274, filed on Jul. 28, 2011.

(30) Foreign Application Priority Data

Aug. 2, 2010 (JP) .................................. 2010-173598

(51) Int. Cl.
*H01L 31/18* (2006.01)
*H01L 21/18* (2006.01)
*H01L 31/0747* (2012.01)
*H01L 31/0224* (2006.01)
*H01L 31/068* (2012.01)

(52) U.S. Cl.
CPC ............ *H01L 21/18* (2013.01); *H01L 31/0747* (2013.01); *H01L 31/1804* (2013.01); *H01L 31/022441* (2013.01); *H01L 31/0682* (2013.01); *Y02E 10/547* (2013.01)
USPC ............................................................ 438/98

(58) Field of Classification Search
None
See application file for complete search history.

(56) References Cited

U.S. PATENT DOCUMENTS

2012/0012179 A1  1/2012  Asaumi et al.
2013/0137211 A1* 5/2013  Mishima ........................ 438/98

FOREIGN PATENT DOCUMENTS

| EP | 2530729 A1 | 12/2012 |
| JP | 61-006828 A | 1/1986 |
| JP | 11-026427 A | 1/1999 |
| JP | 2005-101240 A | 4/2005 |
| JP | 2007-103572 A | 4/2007 |
| JP | 2008-517451 A | 5/2008 |
| JP | 2008-529265 A | 7/2008 |

(Continued)

Primary Examiner — Seahvosh Nikmanesh
(74) Attorney, Agent, or Firm — Marvin A. Motsenbocker; Mots Law, PLLC

(57) ABSTRACT

A manufacturing includes forming an insulating layer covering a portion of a first semiconductor layer on a semiconductor substrate, removing a portion of the first semiconductor layer which is not covered with the insulating layer with an etchant to expose a potion of the first main surface, and cleaning the first main surface using a cleaning liquid containing hydrofluoric acid. An etching rate by the etchant to etch the first semiconductor layer is higher than an etching rate by the etchant to etch a first surface layer of the insulating layer, the first surface layer being on the side opposite to the first semiconductor layer. An etching rate by the cleaning liquid to etch a second surface layer of the insulating layer, the second surface layer being on the first semiconductor layer side, is lower than an etching rate by the cleaning liquid to etch the first surface layer.

10 Claims, 7 Drawing Sheets

(56) References Cited    * cited by examiner

FOREIGN PATENT DOCUMENTS

| JP | 2009-088098 | A  | 4/2009  |
| WO | 2010/113750 | A1 | 10/2010 |
| WO | 2011/093329 | A1 | 8/2011  |

METHOD OF MANUFACTURING SOLAR CELL

CROSS REFERENCE TO RELATED APPLICATIONS

This application is a continuation application of International Application No. PCT/JP2011/0067274, filed on Jul. 28, 2011, entitled "METHOD OF MANUFACTURING SOLAR CELL", which claims priority based on Article 8 of Patent Cooperation Treaty from prior Japanese Patent Applications No. 2010-173598, filed on Aug. 2, 2010, the entire contents of which are incorporated herein by reference.

BACKGROUND OF THE INVENTION

1. Field of the Invention

This disclosure relates to a method of manufacturing a solar cell, and more particularly relates to a method of manufacturing a back contact solar cell.

2. Description of Related Art

There has heretofore been known so-called aback contact solar cell which has p-type and n-type semiconductor regions formed on aback surface side of the solar cell and has no electrodes formed on a light-receiving surface side (for example, Patent Document 1 below). In this back contact solar cell, no electrodes need to be provided on the light-receiving surface side. Thus, the back contact solar cell can improve light reception efficiency. Therefore, higher power generation efficiency can be achieved. Moreover, connection of the solar cell by wiring can be performed only on the back surface side. Thus, wide wiring materials can be used, which can prevent a voltage drop due to wiring to connect multiple solar cells by use of wiring materials.

Patent Document 1: Japanese Patent Application Publication No. 2005-101240

SUMMARY OF THE INVENTION

As described above, the back contact solar cell described in Patent Document 1 can achieve high power generation efficiency. However, there is also a demand for further improvement of the power generation efficiency of the solar cell.

An embodiment of the invention has been made in consideration of the foregoing circumstances. An object of an embodiment of the invention is to provide a method of manufacturing a solar cell having improved power generation efficiency.

In a method of manufacturing a solar cell according to an aspect of the invention, a semiconductor substrate is prepared, which has first and second main surfaces and has a first semiconductor layer formed on the first main surface, the first semiconductor layer being made of a semiconductor having one of p-type conductivity and n-type conductivity. An insulating layer is formed so as to cover a portion of the first semiconductor layer. A portion of the first semiconductor layer, which is not covered with the insulating layer, is removed by etching with an etchant, thereby exposing a portion of the first main surface of the semiconductor substrate. The first main surface of the semiconductor substrate is cleaned using a cleaning liquid containing hydrofluoric acid. A second semiconductor layer made of a semiconductor having the other conductivity of the p-type conductivity and n-type conductivity is formed on the exposed portion of the first main surface of the semiconductor substrate. Then, electrodes are formed on the first and second semiconductor layers, respectively. The insulating layer has a first surface layer, the first surface layer being on the opposite side to the first semiconductor layer, and a second surface layer, the second surface layer being on the first semiconductor layer side. The insulating layer is formed such that an etching rate by the etchant to etch the first semiconductor layer is higher than an etching rate by the etchant to etch the first surface layer of the insulating layer and that an etching rate by the cleaning liquid to etch the second surface layer of the insulating layer is lower than an etching rate by the cleaning liquid to etch the first surface layer of the insulating layer.

The aspect of the invention can provide a method of manufacturing a solar cell having improved power generation efficiency.

DETAILED DESCRIPTION OF EMBODIMENTS

Figure 1:
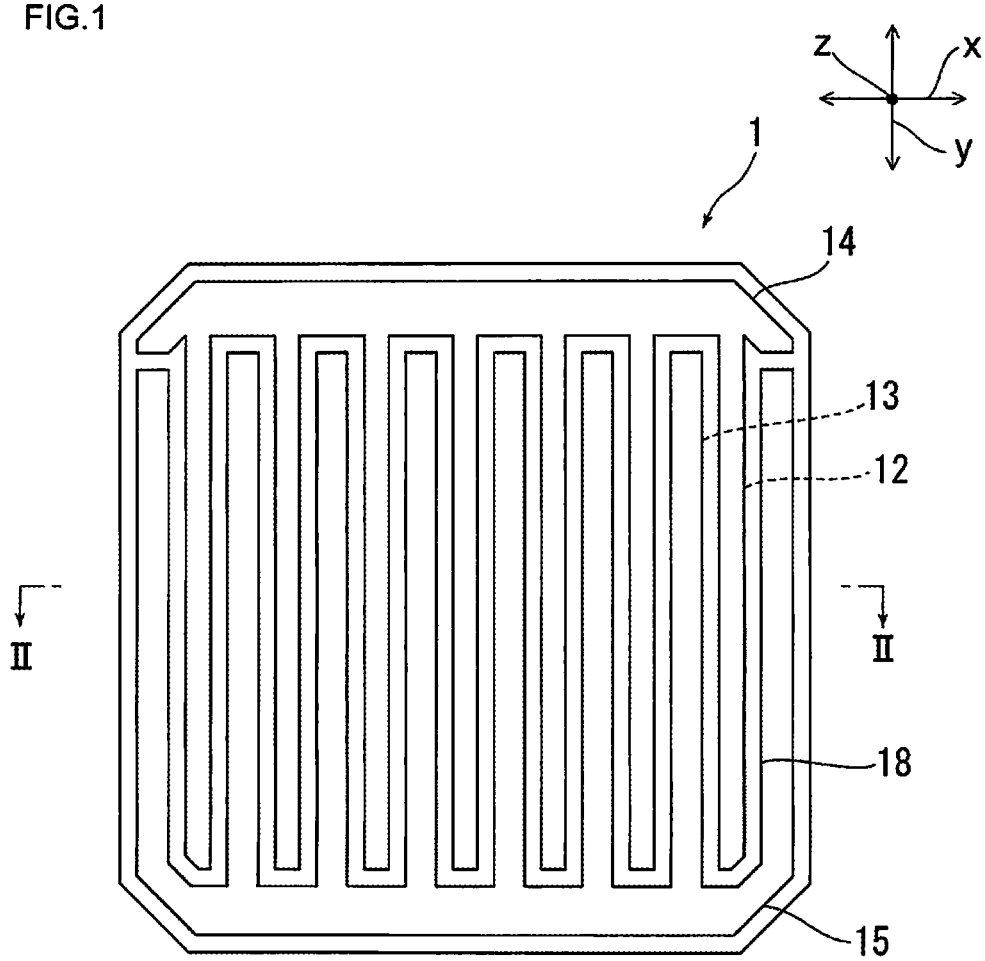
FIG. 1 is a schematic plan view of a solar cell according to a first embodiment.

Preferred embodiment(s) of the invention are described below. However, the following embodiment(s) are provided as examples but are not intended to limit the invention thereto.

Note that, in the drawings to be referred to in the embodiments and the like, members having substantially the same functions are denoted by the same reference numerals. In addition, the drawings to be referred to in the embodiments and the like are schematic and ratios of dimensions and the like are different from actual ones. Moreover, the drawings also include portions having different dimensional relationships and ratios from each other. Therefore, specific dimensions and the like should be determined in consideration of the following description.

First Embodiment

Configuration of Solar Cell 1

First, a configuration of solar cell 1 to be manufactured in this embodiment is described in detail with reference to FIGS. 1 and 2.

Solar cell 1 is a back contact solar cell. Note that when solar cell 1 of this embodiment cannot achieve a sufficiently large output by itself, multiple solar cells 1 may be connected by wiring and used as a solar cell module.

Figure 2:
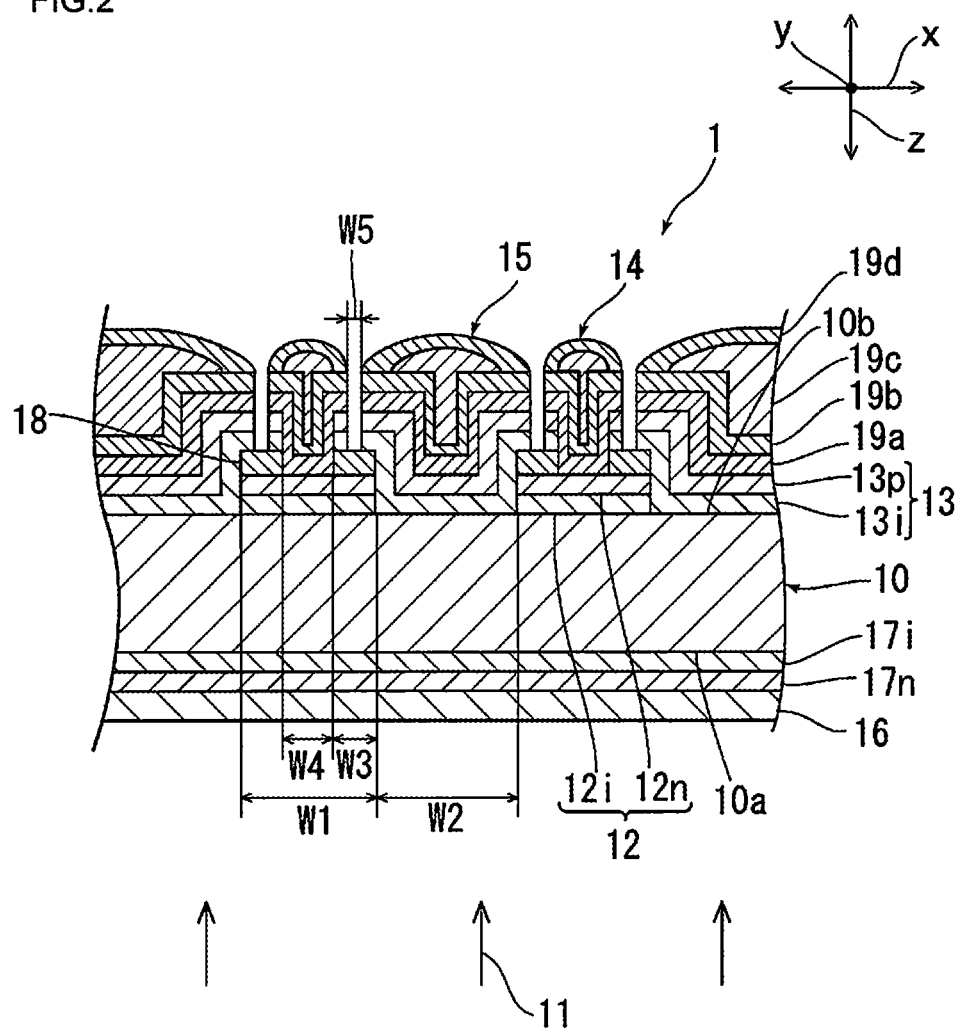
FIG. 2 is a schematic cross-sectional view taken along the line II-II in FIG. 1.

As shown in FIG. 2, solar cell 1 includes semiconductor substrate 10. Semiconductor substrate 10 has light-receiving surface 10a as a second main surface and back surface 10b as a first main surface. Semiconductor substrate 10 receives light 11 on light-receiving surface 10a to generate carriers. Here, the carriers are holes and electrons to be generated by semiconductor substrate 10 absorbing light.

Semiconductor substrate 10 is formed of a crystalline semiconductor substrate having n-type or p-type conductivity. Specific examples of the crystalline semiconductor substrate include crystalline silicon substrates such as a single-crystal silicon substrate and a polycrystalline silicon substrate, for example.

Note that the semiconductor substrate can also be formed of a semiconductor substrate other than the crystalline semiconductor substrate. For example, a compound semiconductor substrate made of GaAs, InP or the like can be used in place of semiconductor substrate 10. In this embodiment, description is given below of an example where semiconductor substrate 10 is formed using an n-type single-crystal silicon substrate.

On light-receiving surface 10a of semiconductor substrate 10, i-type amorphous semiconductor layer 17i is formed, which is made of an intrinsic amorphous semiconductor (the intrinsic semiconductor is hereinafter referred to as the "i-type semiconductor"). To be more specific, in this embodiment, i-type amorphous semiconductor layer 17i is formed of i-type amorphous silicon containing hydrogen. The thickness of i-type amorphous semiconductor layer 17i is not particularly limited as long as it does not substantially contribute to power generation. The thickness of i-type amorphous semiconductor layer 17i can be set to, for example, about several Å to 250 Å.

Note that, in the invention, the "amorphous semiconductor" includes a microcrystalline semiconductor. The microcrystalline semiconductor is a semiconductor in which an average particle size of semiconductor crystal deposited in the amorphous semiconductor is in the range of 1 nm to 50 nm.

On i-type amorphous semiconductor layer 17i, n-type amorphous semiconductor layer 17n is formed, which has the same conductivity as that of semiconductor substrate 10. N-type amorphous semiconductor layer 17n is an amorphous semiconductor layer which is doped with an n-type dopant and has the n-type conductivity. To be more specific, in this embodiment, n-type amorphous semiconductor layer 17n is made of n-type amorphous silicon containing hydrogen. The thickness of n-type amorphous semiconductor layer 17n is not particularly limited. The thickness of n-type amorphous semiconductor layer 17n can be set to, for example, about 20 Å to 500 Å.

On n-type amorphous semiconductor layer 17n, insulating layer 16 is formed, which serves both as an antireflection film and as a protective film. Insulating layer 16 can be formed of, for example, silicon oxide, silicon nitride, silicon oxynitride or the like. The thickness of insulating layer 16 can be set according to antireflection properties and the like of the antireflection film to be provided. The thickness of insulating layer 16 can be set to, for example, about 80 nm to 1 µm. The laminate structure of i-type amorphous semiconductor layer 17i, n-type amorphous semiconductor layer 17n and insulating layer 16 described above functions as a passivation layer and as an antireflection film for semiconductor substrate 10.

On back surface 10b of semiconductor substrate 10, IN laminate 12 and IP laminate 13 are formed. As shown in FIG. 1, each of IN laminate 12 and IP laminate 13 is formed in a comb-teeth shape. IN laminate 12 and IP laminate 13 are configured to mesh with each other. Thus, on back surface 10b, IN laminate 12 and IP laminate 13 are alternately arranged along direction x perpendicular to intersection width direction y. IN laminate 12 and IP laminate 13 which are adjacent to each other in direction x are in contact with each other. More specifically, in this embodiment, substantially the entire back surface 10b is covered with IN laminate 12 and IP laminate 13. Note that width W1 (see FIG. 2) of IN laminate 12 and interval W2 of IN laminate 12 in direction x can be set to, for example, about 100 µm to 1.5 mm, respectively. Width W1 and interval W2 may be equal to or different from each other.

IN laminate 12 is a laminate including i-type amorphous semiconductor layer 12i formed on back surface 10b and n-type amorphous semiconductor layer 12n formed on i-type amorphous semiconductor layer 12i. As in the case of i-type amorphous semiconductor layer 17i described above, i-type amorphous semiconductor layer 12i is made of i-type amorphous silicon containing hydrogen. The thickness of i-type amorphous semiconductor layer 12i is not particularly limited as long as it does not substantially contribute to power generation. The thickness of i-type amorphous semiconductor layer 12i can be set to, for example, about several Å to 250 Å.

As in the case of n-type amorphous semiconductor layer 17n described above, n-type amorphous semiconductor layer 12n is doped with an n-type dopant and has the same n-type conductivity as that of semiconductor substrate 10. To be more specific, in this embodiment, n-type amorphous semiconductor layer 12n is made of n-type amorphous silicon containing hydrogen. The thickness of n-type amorphous semiconductor layer 12n is not particularly limited. The thickness of n-type amorphous semiconductor layer 12n can be set to, for example, about 20 Å to 500 Å.

Insulating layer 18 is formed on both end portions of IN laminate 12 in direction x except for a center portion thereof. The center portion of IN laminate 12 in direction x is exposed from insulating layer 18. Width W3 of insulating layer 18 in direction x is not particularly limited and may be set to, for example, about ⅓ of width W1. Moreover, interval W4 between insulating layers 18 in direction x is also not particularly limited but can be set to, for example, about ⅓ of width W1.

In this embodiment, insulating layer 18 is formed of silicon nitride. However, the material of insulating layer 18 is not particularly limited. Insulating layer 18 may be formed of, for example, silicon oxide, silicon oxynitride or the like. Also, insulating layer 18 may contain hydrogen.

IP laminate 13 is formed on a portion of back surface 10b exposed from IN laminate 12 and on end portions of insulating layer 18. Thus, both end portions of IP laminate 13 overlap with IN laminate 12 in height direction z.

IP laminate 13 is a laminate including i-type amorphous semiconductor layer 13i formed on back surface 10b and p-type amorphous semiconductor layer 13p formed on i-type amorphous semiconductor layer 13i.

I-type amorphous semiconductor layer 13i is made of i-type amorphous silicon containing hydrogen. The thickness of i-type amorphous semiconductor layer 13i is not particularly limited as long as it does not substantially contribute to power generation. The thickness of i-type amorphous semiconductor layer 13i can be set to, for example, about several Å to 250 Å.

p-type amorphous semiconductor layer 13p is an amorphous semiconductor layer which is doped with a p-type dopant and has a p-type conductivity. To be more specific, in this embodiment, p-type amorphous semiconductor layer 13p is made of p-type amorphous silicon containing hydrogen. The thickness of p-type amorphous semiconductor layer 13p is not particularly limited. The thickness of p-type amorphous semiconductor layer 13p can be set to, for example, about 20 Å to 500 Å.

As described above, this embodiment has a structure in which i-type amorphous semiconductor layer 13i having the thickness that does not substantially contribute to power generation is provided between crystalline semiconductor substrate 10 and p-type amorphous semiconductor layer 13p. By adopting such a structure in this embodiment, minority carriers can be prevented from being recombined at the junction interface between semiconductor substrate 10 and IN laminate 12 and IP laminate 13. As a result, photoelectric conversion efficiency can be improved.

Note that it is preferable that amorphous semiconductor layers 17, 12 and 13 contain hydrogen.

On n-type amorphous semiconductor layer 12n, n-side electrode 14 is formed to collect electrons. On the other hand, on p-type amorphous semiconductor layer 13p, p-side electrode 15 is formed to collect holes. P-side electrode 15 and n-side electrode 14 are electrically insulated from each other. Note that distance W5 between n-side electrode 14 and p-side electrode 15 on insulating layer 18 can be set to, for example, about ⅓ of width W3.

As described above, in this embodiment, each of IN laminate 12 and IP laminate 13 is formed in the comb-teeth shape. Thus, each of n-side electrode 14 and p-side electrode 15 is formed in a comb-teeth shape including bus bars and multiple fingers. However, each of n-side electrode 14 and p-side electrode 15 may be a so-called bus bar-less electrode including only multiple fingers and having no bus bar.

n-side electrode 14 and p-side electrode 15 are not particularly limited as long as they can collect carriers. In this embodiment, each of n-side electrode 14 and p-side electrode 15 includes a laminate of first to fourth conductive layers 19a to 19d.

First conductive layer 19a can be formed of TCO (Transparent Conductive Oxide) or the like, such as ITO (indium tin oxide), for example. To be more specific, in this embodiment, first conductive layer 19a is formed of ITO. The thickness of first conductive layer 19a can be set to, for example, about 50 to 100 nm.

Second to fourth conductive layers 19b to 19d can be formed of metal or alloy such as Cu, for example. To be more specific, in this embodiment, second and third conductive layers 19b and 19c are formed of Cu, respectively. Fourth conductive layer 19d is formed of Sn. The thicknesses of second to fourth conductive layers 19b to 19d can be set to, for example, about 50 nm to 1 µm, about 10 µm to 20 µm, and about 1 µm to 5 µm, respectively.

Note that a method for forming first to fourth conductive layers 19a to 19d is not particularly limited but can be formed using a thin-film formation method, such as a sputtering method and a CVD method, a plating method or the like, for example. To be more specific, in this embodiment, first and second conductive layers 19a and 19b are formed using the thin-film formation method, and third and fourth conductive layers 19c and 19d are formed using the plating method.

Next, a method of manufacturing solar cell 1 of this embodiment is described mainly with reference to FIGS. 3 to 12.

Figure 3:
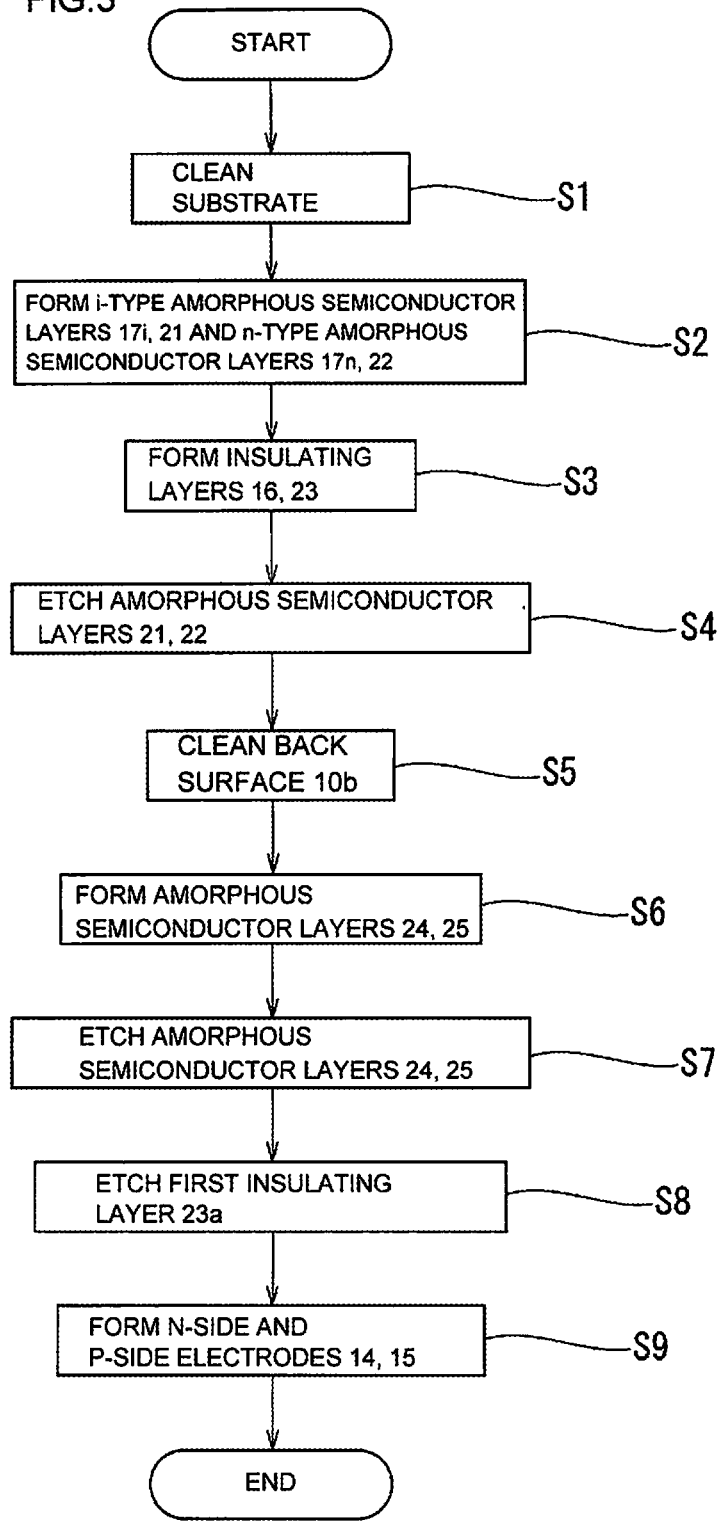
FIG. 3 is a flowchart showing steps of manufacturing a solar cell according to the first embodiment.
Figure 4:
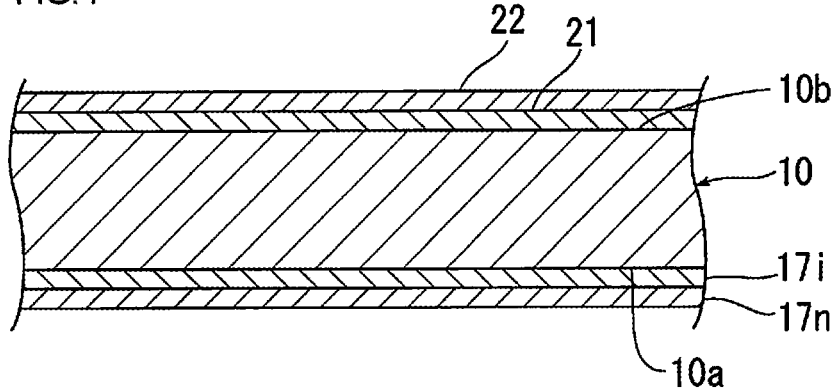
FIG. 4 is a schematic cross-sectional view for explaining the steps of manufacturing a solar cell.
Figure 5:
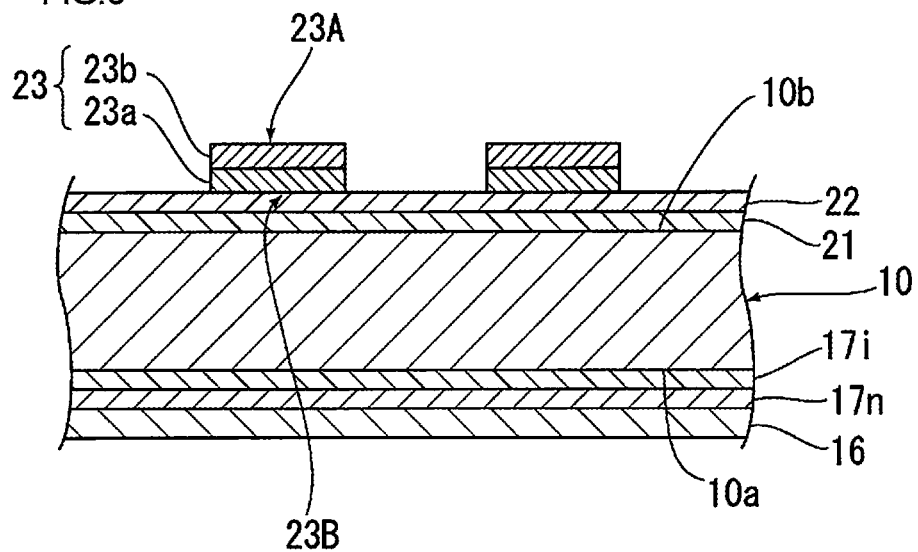
FIG. 5 is a schematic cross-sectional view for explaining the steps of manufacturing the solar cell.
Figure 6:
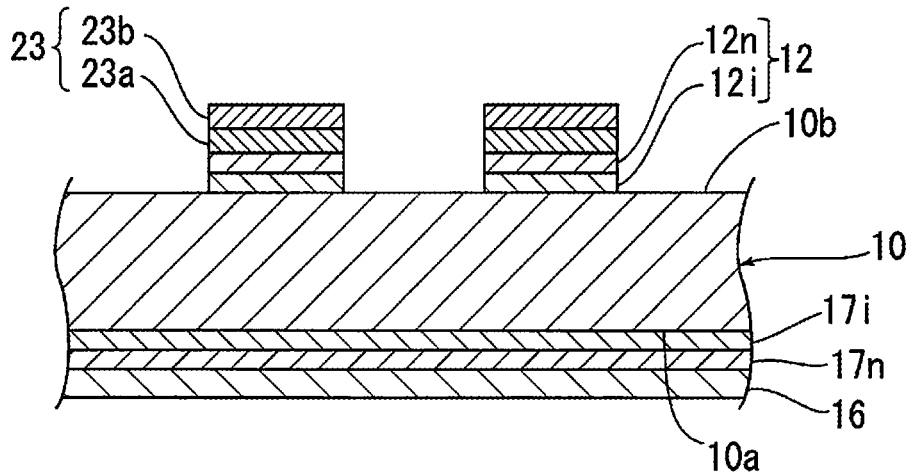
FIG. 6 is a schematic cross-sectional view for explaining the steps of manufacturing the solar cell.

First, semiconductor substrate 10 (see FIGS. 4 and 2) is prepared. Next, as shown in FIG. 3, light-receiving surface 10a and back surface 10b of semiconductor substrate 10 are cleaned in Step S1. Semiconductor substrate 10 can be cleaned using, for example, an HF solution or the like. Note that, in this Step S1, a texture structure is formed on light-receiving surface 10a.

Next, in Step S2, i-type amorphous semiconductor layer 17i and n-type amorphous semiconductor layer 17n are formed on light-receiving surface 10a of semiconductor substrate 10, and i-type amorphous semiconductor layer 21 and n-type amorphous semiconductor layer 22 are formed on back surface 10b. A method for forming i-type amorphous semiconductor layers 17i and 21 as well as n-type amorphous semiconductor layers 17n and 22 is not particularly limited. I-type amorphous semiconductor layers 17i and 21 as well as n-type amorphous semiconductor layers 17n and 22 may be formed using, for example, a CVD (Chemical Vapor Deposition) method, such as a plasma CVD method, or the like.

Then, in Step S3, insulating layer 16 is formed on n-type amorphous semiconductor layer 17n, and insulating layer 23 is formed on n-type amorphous semiconductor layer 22. Note that insulating layer 16 is formed so as to cover substantially the entire n-type amorphous semiconductor layer 17n, while insulating layer 23 is formed so as to cover a part of n-type amorphous semiconductor layer 22, using a metal mask or the like, for example. Note that insulating layer 23 may be formed by etching a part of an insulating layer formed covering substantially the entire n-type amorphous semiconductor layer 22.

In this embodiment, as insulating layer 23, a laminate of first insulating layer 23a and second insulating layer 23b is formed. First and second insulating layers 23a and 23b are formed such that a ratio of Si to N (Si/N) is smaller in second insulating layer 23b than in first insulating layer 23a. Thus, the ratio of Si to N (Si/N) in first surface layer 23A of insulating layer 23, first surface layer 23A being on the side opposite to n-type amorphous semiconductor layer 22, is smaller than that in second surface layer 23B of insulating layer 23, second surface layer 23B being on n-type amorphous semiconductor layer 22 side. To be more specific, it is preferable that first and second insulating layers 23a and 23b are formed such that first insulating layer 23a has a refractive index of 2.1 to 2.3 and second insulating layer 23b has a refractive index of 1.9 to 2.1.

Note that control of the ratio of Si to N (Si/N) in first and second insulating layers 23a and 23b can be performed by adjusting a ratio between an N source gas and a Si source gas to be supplied when first and second insulating layers 23a and 23b are formed using the CVD (Chemical Vapor Deposition) method, such as the plasma CVD method. To be more specific, when thin film formation using the CVD method is performed by supplying, for example, $SiH_4$ gas and $NH_3$ gas as the N source gas, the ratio of Si to N (Si/N) can be controlled by adjusting a flow ratio between $SiH_4$ gas and $NH_3$ gas.

Next, in Step S4, using insulating layer 23 as a mask, i-type amorphous semiconductor layer 21 and n-type amorphous semiconductor layer 22 are etched with an alkaline etchant including NaOH, KOH or the like. Thus, portions of i-type amorphous semiconductor layer 21 and n-type amorphous semiconductor layer 22, other than those covered with insulating layer 23 are removed. Accordingly, a portion of back surface 10b, above which no insulating layer 23 is located, is exposed, and i-type amorphous semiconductor layer 12i and n-type amorphous semiconductor layer 12n (see FIG. 2) are formed using semiconductor layers 21 and 22.

Next, in Step S5, back surface 10b of semiconductor substrate 10 is cleaned using a cleaning liquid that contains hydrofluoric acid.

Here, in this embodiment, first and second insulating layers 23a and 23b are formed such that the ratio of Si to N (Si/N) is smaller in second insulating layer 23b than in first insulating layer 23a. Thus, the alkaline etchant including NaOH, KOH or the like, which is used in Step S4, has a higher etching rate to etch n-type amorphous semiconductor layer 22 than that to etch insulating layer 23b. For this reason, in Step S4, second insulating layer 23b remains, and favorably protects the portions of n-type amorphous semiconductor layer 22 and i-type amorphous semiconductor layer 21 which are covered with insulating layer 23.

Figure 7:
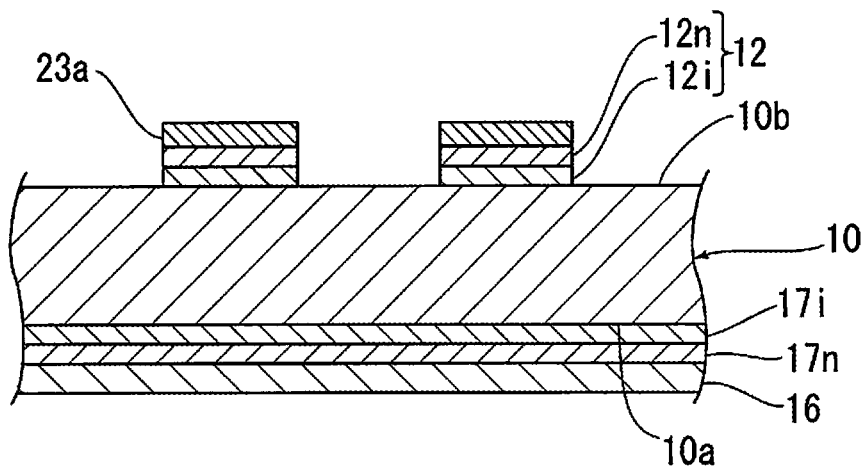
FIG. 7 is a schematic cross-sectional view for explaining the steps of manufacturing the solar cell.
Figure 8:
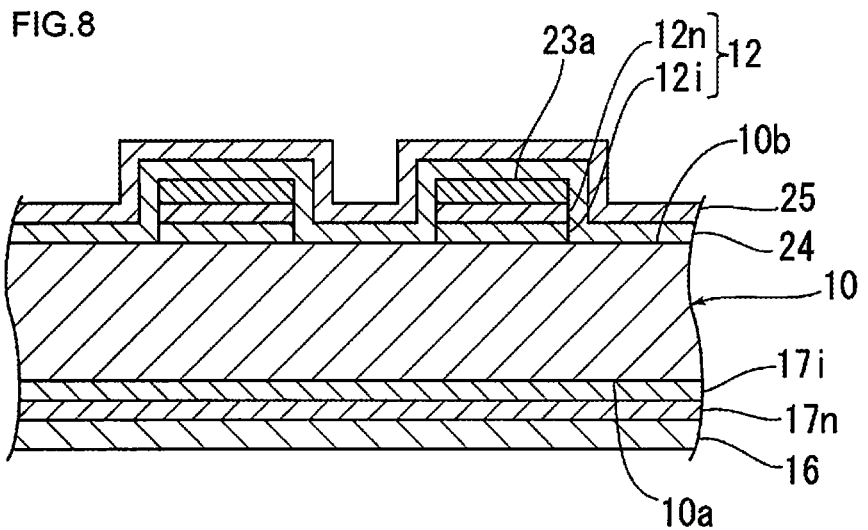
FIG. 8 is a schematic cross-sectional view for explaining the steps of manufacturing the solar cell.
Figure 9:
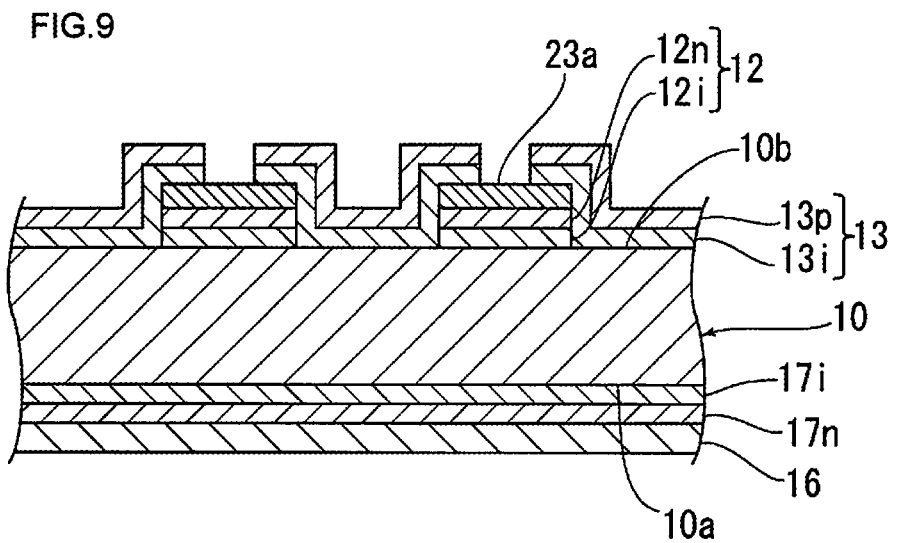
FIG. 9 is a schematic cross-sectional view for explaining the steps of manufacturing the solar cell.
Figure 10:
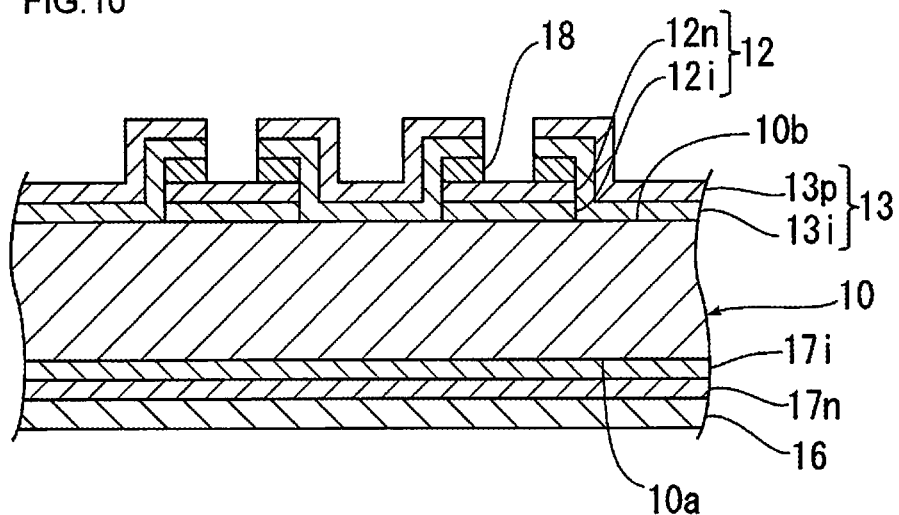
FIG. 10 is a schematic cross-sectional view for explaining the steps of manufacturing the solar cell.
Figure 11:
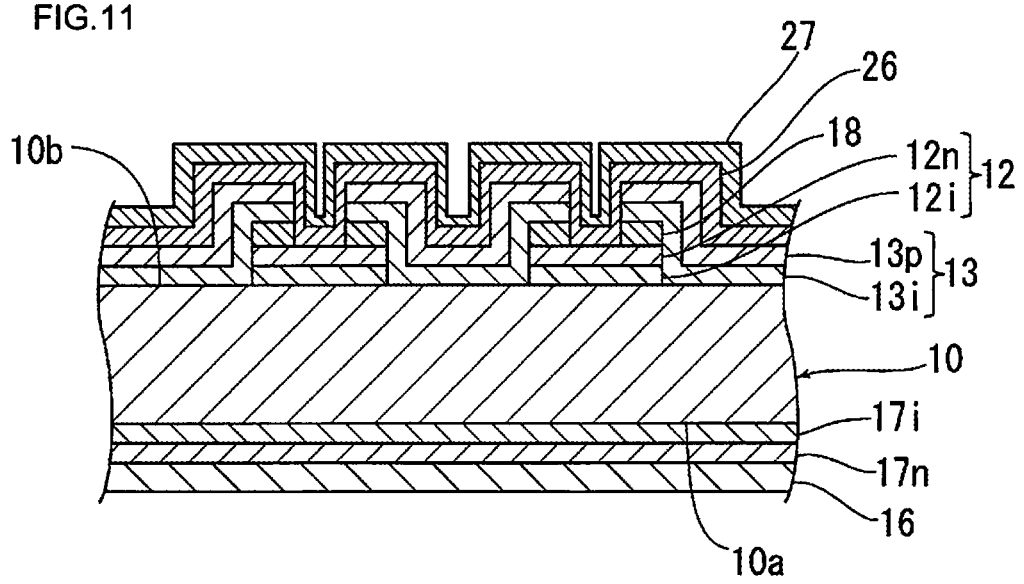
FIG. 11 is a schematic cross-sectional view for explaining the steps of manufacturing the solar cell.

On the other hand, second insulating layer 23b is etched at a high etching rate by the cleaning liquid containing hydrofluoric acid used in Step S5. Thus, as shown in FIG. 7, second insulating layer 23b disappears in Step S5. However, the etching rate by the cleaning liquid to etch first insulating layer 23a having large Si/N is lower than the etching rate by the cleaning liquid to etch second insulating layer 23b. For this reason, first insulating layer 23a is slightly soluble in the cleaning liquid containing hydrofluoric acid. Therefore, first insulating layer 23a is unlikely to disappear in Step S5.

Note that, from the viewpoint of more favorable etching of n-type amorphous semiconductor layer 22 and i-type amorphous semiconductor layer 21, the etching rate to etch n-type amorphous semiconductor layer 22 is preferably 1.1 times or more larger, more preferably 5 times or more larger, still more preferably 10 times or more larger of the etching rate to etch insulating layer 23b.

Moreover, the cleaning liquid used in Step S5 has an etching rate to etch first insulating layer 23a that is preferably 5 times or more larger, more preferably 10 times or more larger of the etching rate to etch second insulating layer 23b.

Next, in Step S6, i-type amorphous semiconductor layer 24 and p-type amorphous semiconductor layer 25 are sequentially formed in this order so as to cover back surface 10b. In this embodiment, since back surface 10b of semiconductor substrate 10 is cleaned in Step S5, semiconductor substrate 10 and i-type amorphous semiconductor layer 24 can be favorably joined. Thus, high photoelectric conversion efficiency can be achieved.

Note that a method for forming amorphous semiconductor layers 24 and 25 is not particularly limited. Amorphous semiconductor layers 24 and 25 can be formed using the thin-film formation method such as the sputtering method and the CVD method, for example.

Thereafter, in Step S7, portions of amorphous semiconductor layers 24 and 25, which are located on first insulating layer 23a, are partially etched. Thus, i-type amorphous semiconductor layer 13i and p-type amorphous semiconductor layer 13p are formed from amorphous semiconductor layers 24 and 25.

This Step S7 uses an etchant having a higher etching rate for amorphous semiconductor layers 24 and 25 than the etching rate to etch first insulating layer 23a. For this reason, amorphous semiconductor layers 24 and 25 are selectively etched among first insulating layer 23a and amorphous semiconductor layers 24 and 25.

It is preferable that the etching rate by the first etchant to etch amorphous semiconductor layers 24 and 25 is 1.1 times or more larger, preferably 1.5 times or more larger, more preferably twice or more larger of the etching rate to etch first insulating layer 23a. Furthermore, it is preferable that the first etchant should etch amorphous semiconductor layers 24 and 25 while not substantially etching first insulating layer 23a. Specific examples of such first etchant, for a case where amorphous semiconductor layers 24 and 25 are made of silicon and first insulating layer 23a is made of silicon oxide, silicon nitride or silicon oxynitride, include an alkaline aqueous solution such as an NaOH solution containing NaOH and a KOH solution containing KOH, TMAH (tetramethylammonium hydroxide), and the like, for example. Moreover, the first etchant does not always have to be a liquid, i.e., an etching liquid. The first etchant may be a gas, for example. Specific examples of an etching gas preferably used as the first etchant include $Cl_2$ gas, $CF_4$ gas, $SF_6$ gas, HBr gas and the like, for example.

Note that the "etchant" in the invention includes an etching paste and a viscosity-adjusted etching ink.

Next, as shown in FIG. 3, first insulating layer 23a is etched in Step S8. To be more specific, an exposed portion of first insulating layer 23a is removed by etching with an etchant from above amorphous semiconductor layers 13i and 13p made of amorphous semiconductor layers 24 and 25 partially removed by the etching in Step S7. Thus, n-type amorphous semiconductor layer 12n is exposed, and insulating layer 18 is formed from first insulating layer 23a.

This Step S8 uses a second etchant having a higher etching rate to etch first insulating layer 23a than the etching rate to etch amorphous semiconductor layers 24 and 25. For this reason, first insulating layer 23a is selectively etched among first insulating layer 23a and amorphous semiconductor layers 24 and 25.

It is preferable that the etching rate by the second etchant to etch first insulating layer 23a is 10 times or more larger, preferably 15 times or more larger, more preferably 20 times or more larger, still more preferably 100 times or more larger of the etching rate to etch amorphous semiconductor layers 24 and 25. Furthermore, it is preferable that the second etchant should etch first insulating layer 23a while not substantially etching amorphous semiconductor layers 24 and 25. Specific examples of such second etchant, for a case where amorphous semiconductor layers 24 and 25 are made of silicon and first insulating layer 23a is made of silicon oxide, silicon nitride or silicon oxynitride, include an HF solution containing HF, an $NH_4F$ solution, and the like, for example. Moreover, as in the case of the first etchant, the second etchant does not always have to be a liquid, i.e., an etching liquid. The second etchant may be a gas, for example. Specific examples of an etching gas preferably used as the second etchant include $CF_4$ gas, $CHF_3$ gas, and the like, for example.

Next, in Step S9, solar cell 1 can be completed by performing an electrode formation step to form n-side electrode 14 and p-side electrode 15 on n-type amorphous semiconductor layer 12n and p-type amorphous semiconductor layer 13p, respectively.

In this embodiment, p-type amorphous semiconductor layer 13p has a function to form an HIT junction with semiconductor substrate 10 and a function as a mask layer to form a contact hole in insulating layer 18. In other words, according to this embodiment, the semiconductor layer to form the HIT junction with semiconductor substrate 10 and the mask layer for contact hole formation are formed in the same step. Thus, the manufacturing time can be reduced.

A method for forming n-side electrode 14 and p-side electrode 15 can be selected according to the materials of the electrodes. More specifically, in this embodiment, n-side electrode 14 and p-side electrode 15 are formed as follows.

First, conductive layer 26 made of TCO and conductive layer 27 made of metal or alloy such as Cu are formed in this order using a CVD (Chemical Vapor Deposition) method such as a plasma CVD method or a thin-film formation method such as a sputtering method.

Figure 12:
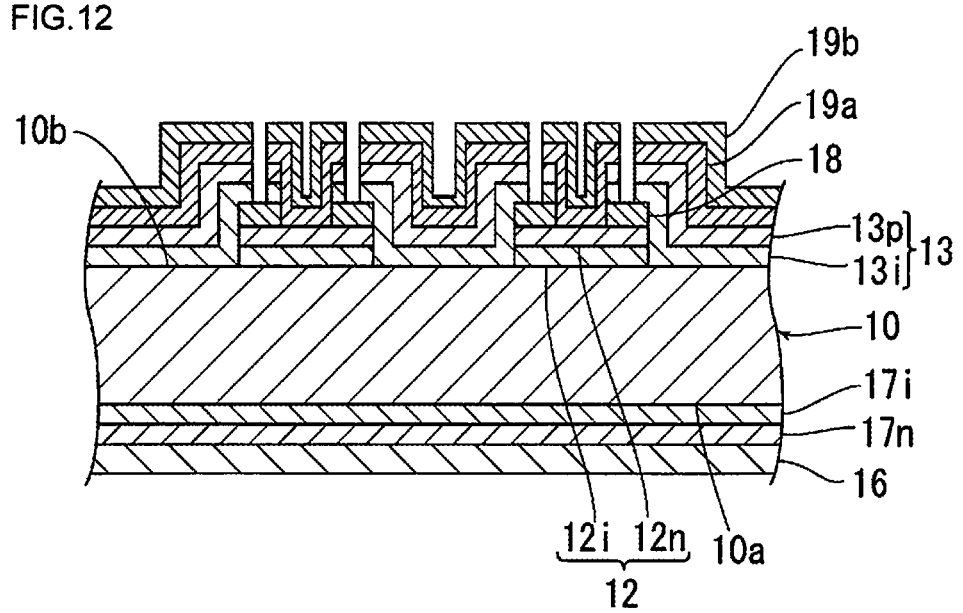
FIG. 12 is a schematic cross-sectional view for explaining the steps of manufacturing the solar cell.

Next, as shown in FIG. 12, portions of conductive layers 26 and 27, which are positioned above insulating layer 18, are divided. Thus, first and second conductive layers 19a and 19b are formed from conductive layers 26 and 27. Note that the division of conductive layers 26 and 27 can be performed using, for example, a photolithography method or the like.

Next, third conductive layer 19c made of Cu and fourth conductive layer 19d made of Sn are sequentially formed by electrolytic plating on first and second conductive layers 19a and 19b formed on n-type amorphous semiconductor layer 12n and p-type amorphous semiconductor layer 13p. Thus, n-side electrode 14 and p-side electrode 15 shown in FIG. 2 can be completed.

Meanwhile, it is also conceivable that the insulating layer positioned on the semiconductor layer formed on the back surface of the semiconductor substrate is integrally formed of silicon nitride having a substantially constant Si/N. However, in such a case, the insulating layer becomes soluble in the alkaline etchant for etching the semiconductor layer or the cleaning liquid containing hydrofluoric acid. For example, when the insulating layer is soluble in the alkaline etchant, the insulating layer disappears in the etching step of the semiconductor layer, and the semiconductor layer sometimes cannot be favorably patterned. On the other hand, when the insulating layer is soluble in the cleaning liquid containing hydrofluoric acid, the insulating layer disappears in the cleaning step of the back surface of the semiconductor substrate. This makes it difficult to accurately form the n-side or p-side electrode on each of the n-type semiconductor layer and the p-type semiconductor layer. To be more specific, when the insulating layer has disappeared, the n-side and p-side electrodes need to be formed by the thin-film formation step using a metal mask. However, it is difficult to arrange the metal mask with high positional accuracy. This makes it difficult to reduce the pitch between the n-side and p-side electrodes. For this reason, the increased pitch between the n-side and p-side electrodes makes minority carriers likely to be recombined. As a result, it becomes difficult to achieve high photoelectric conversion efficiency.

On the other hand, in this embodiment, the etchant used in Step S4 has a higher etching rate to etch n-type amorphous semiconductor layer 22 is higher than the etching rate to etch second insulating layer 23b. Moreover, the cleaning liquid has a lower etching rate to etch first insulating layer 23a than the etching rate to etch second insulating layer 23b. Therefore, etching of n-type amorphous semiconductor layer 22 and cleaning of back surface 10b can be favorably performed. Moreover, second insulating layer 23b remains even after the etching step of Step S4 and the cleaning step of Step S5. Thus, using second insulating layer 23b, n-side electrode 14 and p-side electrode 15 can be formed with high positional accuracy and with a narrow pitch. As a result, solar cell 1 having improved power generation efficiency can be manufactured.

Particularly, in this embodiment, the entire back surface 10b is covered with n-type amorphous semiconductor layer 12n or p-type amorphous semiconductor layer 13p. Thus, higher photoelectric conversion efficiency can be achieved.

In this embodiment, insulating layer 23 is formed of silicon nitride. Thus, insulating layer 18 formed of insulating layer 23 has high gas barrier properties. Therefore, solar cell 1 having excellent weather resistance can be manufactured.

In this embodiment, insulating layer 18 is formed on one of n-type amorphous semiconductor layer 12n and p-type amorphous semiconductor layer 13p, i.e., on n-type amorphous semiconductor layer 12n. In other words, the semiconductor layer positioned below insulating layer 18 is n-type amorphous semiconductor layer 12n. Moreover, p-side electrode 15 is formed on substantially the entire p-type amorphous semiconductor layer 13p. Thus, holes which are the minority carriers are likely to be collected in p-side electrode 15. Therefore, the photoelectric conversion efficiency of solar cell 1 obtained can be further improved.

However, when the semiconductor substrate has the p-type conductivity, the minority carriers are electrons. Thus, it is preferable that the first semiconductor layer positioned below the insulating layer is formed of a p-type semiconductor.

Moreover, in this embodiment, p-type amorphous semiconductor layer 13p is formed such that back surface 10b of semiconductor substrate 10 made of the crystalline semiconductor is substantially entirely covered with n-type amorphous semiconductor layer 12n and p-type amorphous semiconductor layer 13p. Thus, back surface 10b of semiconductor substrate 10 made of the crystalline semiconductor is substantially not exposed. Therefore, holes which are the minority carriers are unlikely to be recombined in back surface 10b of semiconductor substrate 10. Thus, the photoelectric conversion efficiency of solar cell 1 obtained can be further improved.

In this embodiment, after the division of first and second conductive layers 19a and 19b formed by the thin-film formation method, third and fourth conductive layers 19c and 19d are formed by plating. Thus, division of the electrodes can be performed more easily and quickly compared with the case where, for example, all first to fourth conductive layers 19a to 19d are formed and then divided into n-side electrode 14 and p-side electrode 15.

Moreover, since the division of first and second conductive layers 19a and 19b is performed on insulating layer 18, n-type amorphous semiconductor layer 12n and p-type amorphous semiconductor layer 13p are unlikely to be damaged during the division of first and second conductive layers 19a and 19b.

Furthermore, in this embodiment, insulating layer 18, n-side electrode 14 and p-side electrode 15 are formed such that n-type amorphous semiconductor layer 12n and p-type amorphous semiconductor layer 13p are substantially entirely covered with insulating layer 18, n-side electrode 14 and p-side electrode 15. Therefore, according to the manufacturing method of this embodiment, solar cell 1 having more excellent gas barrier properties and weather resistance can be manufactured.

Note that, in the first embodiment described above, the description has been given of the example where insulating layer 23 is formed using the laminate of first and second insulating layers 23a and 23b which are different in Si/N. However, the invention is not limited to such a configuration. For example, insulating layer 23 may be formed of a single silicon nitride layer having Si/N gradually increased from first surface layer 23A side toward second surface layer 23B, for example. Such insulating layer 23 can be formed by gradually changing the flow ratio between $SiH_4$ gas and $NH_3$ gas during formation of insulating layer 23 by the CVD method, for example.

EXPLANATION OF REFERENCE NUMERALS 1 solar cell
10 semiconductor substrate
10a light-receiving surface
10b back surface
11 light
12 IN laminate
12i i-type amorphous semiconductor layer
12n n-type amorphous semiconductor layer
13 IP laminate 13*i* i-type amorphous semiconductor layer
13*p* p-type amorphous semiconductor layer
14 n-side electrode
15 p-side electrode
16 insulating layer
17*i* i-type amorphous semiconductor layer
17*n* n-type amorphous semiconductor layer
18 insulating layer
19*a* first conductive layer
19*b* second conductive layer
19*c* third conductive layer
19*d* fourth conductive layer
21 i-type amorphous semiconductor layer
22 n-type amorphous semiconductor layer
23 insulating layer
23*a* first insulating layer
23*b* second insulating layer
23A first surface layer
23B second surface layer
24 i-type amorphous semiconductor layer
25 p-type amorphous semiconductor layer
26, 27 conductive layer

The invention claimed is:

1. A method of manufacturing a solar cell, comprising:
preparing a semiconductor substrate having first and second main surfaces and having a first semiconductor layer formed on the first main surface, the first semiconductor layer having one of p-type conductivity and n-type conductivity;
forming an insulating layer so as to cover a portion of the first semiconductor layer;
removing a portion of the first semiconductor layer, which is not covered with the insulating layer, by etching with an etchant, and thereby exposing a potion of the first main surface of the semiconductor substrate;
cleaning the exposed portion of the first main surface of the semiconductor substrate using a cleaning liquid containing hydrofluoric acid;
forming a second semiconductor layer on the exposed portion of the first main surface of the semiconductor substrate, the second semiconductor layer having the other conductivity of the p-type conductivity and n-type conductivity; and
forming electrodes on the first and second semiconductor layers, respectively, wherein
the insulating layer is formed such that an etching rate by the etchant to etch the first semiconductor layer is higher than an etching rate by the etchant to etch a first surface layer of the insulating layer, the first surface layer being on the side opposite to the first semiconductor layer, and that an etching rate by the cleaning liquid to etch a second surface layer of the insulating layer, the second surface layer being on the first semiconductor layer side, is lower than an etching rate by the cleaning liquid to etch the first surface layer of the insulating layer.

2. The method of manufacturing a solar cell, according to claim 1, wherein
the insulating layer is formed of silicon nitride in which a ratio of Si to N (Si/N) in the first surface layer is smaller than a ratio of Si to N (Si/N) in the second surface layer.

3. The method of manufacturing a solar cell, according to claim 2, wherein
a first insulating layer and a second insulating layer are formed as the insulating layer, the first insulating layer positioned on the first semiconductor layer, the second insulating layer positioned on the first insulating layer and having a smaller ratio of Si to N (Si/N) than the first insulating layer.

4. The method of manufacturing a solar cell, according to claim 1, wherein
the insulating layer is formed of silicon nitride in which a ratio of Si to N (Si/N) is gradually increased from the first surface layer side toward the second surface layer side.

5. The method of manufacturing a solar cell, according to claim 1, wherein
the insulating layer is formed such that the first surface layer has a refractive index of 1.9 to 2.1 and the second surface layer has a refractive index of 2.1 to 2.3.

6. The method of manufacturing a solar cell, according to claim 1, wherein
the insulating layer is formed by a CVD method.

7. The method of manufacturing a solar cell, according to claim 1, wherein
a crystalline semiconductor substrate is used as the semiconductor substrate.

8. The method of manufacturing a solar cell, according to claim 1, wherein
the second semiconductor layer is formed such that substantially the entire first main surface of the semiconductor substrate is covered with the first semiconductor layer and the second semiconductor layer.

9. The method of manufacturing a solar cell, according to claim 1, wherein
a semiconductor substrate having the first semiconductor layer made of amorphous silicon containing hydrogen is used as the semiconductor substrate, and
the second semiconductor layer is formed of amorphous silicon containing hydrogen.

10. The method of manufacturing a solar cell, according to claim 1, wherein IN laminate and IP laminate are each formed on the back surface in a comb-teeth shape and mesh with each other by their alternately arrangement along direction x perpendicular to intersection width direction y and wherein IN laminate and IP laminate which are adjacent to each other in direction x are in contact with each other.

* * * * *